United States Patent [19]

Wells et al.

[11] Patent Number: 5,416,782
[45] Date of Patent: May 16, 1995

[54] METHOD AND APPARATUS FOR IMPROVING DATA FAILURE RATE TESTING FOR MEMORY ARRAYS

[75] Inventors: Steven E. Wells, Citrus Heights; Anil Sama, Folsom, both of Calif.

[73] Assignee: Intel Corporation, Santa Clara, Calif.

[21] Appl. No.: 969,465

[22] Filed: Oct. 30, 1992

[51] Int. Cl.$^6$ ............................................. G11C 29/00
[52] U.S. Cl. ................................. 371/21.2; 371/21.3; 371/21.4
[58] Field of Search .................... 371/21.2, 21.3, 21.4, 371/21.6, 69.1, 71; 365/201, 189.09

[56] References Cited

U.S. PATENT DOCUMENTS

| | | |
|---|---|---|
| 4,642,759 | 2/1987 | Foster . |
| 4,644,494 | 2/1987 | Muller . |
| 4,667,330 | 5/1987 | Kumagai ............................. 371/71 |
| 4,763,305 | 8/1988 | Kuo . |
| 4,802,117 | 1/1989 | Chrosny et al. . |
| 4,896,262 | 1/1990 | Wayama et al. . |
| 4,958,315 | 9/1990 | Balch . |
| 5,012,425 | 4/1991 | Brown . |
| 5,048,020 | 9/1991 | Miki ................................. 371/21.2 |
| 5,070,474 | 12/1991 | Tuma et al. . |
| 5,077,737 | 12/1991 | Leger et al. . |
| 5,101,490 | 3/1992 | Getson, Jr. et al. . |
| 5,111,385 | 5/1992 | Hattori . |
| 5,131,089 | 7/1992 | Cole . |
| 5,199,033 | 3/1993 | McGeoch et al. . |
| 5,200,959 | 4/1993 | Gross et al. . |
| 5,224,070 | 6/1993 | Fandrich et al. . |
| 5,274,648 | 12/1993 | Eikill et al. ........................ 371/21.2 |
| 5,315,553 | 5/1994 | Morris ............................... 371/21.2 |
| 5,327,363 | 7/1994 | Akiyama ............................ 371/21.2 |

FOREIGN PATENT DOCUMENTS

| | | |
|---|---|---|
| 2088442 | 1/1993 | Canada . |
| 0175458A2 | 3/1986 | European Pat. Off. . |
| 0392895A2 | 10/1990 | European Pat. Off. . |
| 2251323 | 7/1992 | United Kingdom . |
| 2251324A | 7/1992 | United Kingdom . |

OTHER PUBLICATIONS

Markus A. Levy et al., "Solutions for High Density Applications Using Intel Flash Memory," Intel Application Note AP-343, pp. 6-297 through 6-364 (Oct. 1990).

*Primary Examiner*—Vincent P. Canney
*Attorney, Agent, or Firm*—Blakely, Sokoloff, Taylor & Zafman

[57] ABSTRACT

A circuit for testing the data failure rate of a flash memory array comprising apparatus for writing a test pattern to a memory array; and apparatus positioned in a data path prior to the interface between the memory array and circuitry external to the memory array for detecting differences in data read from the memory array and the test pattern written to the memory array, the last mentioned apparatus including apparatus for reading data from the memory array, apparatus for comparing the value of data read from the memory array with the value of data written to the array in the test pattern, and apparatus for storing a indication that a comparison has produced a result indicating a failure to compare.

5 Claims, 3 Drawing Sheets

METHOD AND APPARATUS FOR IMPROVING DATA FAILURE RATE TESTING FOR MEMORY ARRAYS

BACKGROUND OF THE INVENTION

1. Field Of The Invention

This invention relates to memory arrays and, more particularly, to methods and apparatus for enabling the failure rate testing of flash electrically erasable programmable read only memories (flash EEPROMs).

2. History Of The Prior Art

Modern computer systems make extensive use of long term memory. Typically this memory is provided by one or more electro-mechanical hard (fixed) disk drives constructed of flat circular magnetic disks which rotate about a central axis and which have a mechanical arm to write to read from positions on the magnetic disk. Hard disk drives are very useful and have become almost a necessity to the operation of personal computers. However, such electro-mechanical drives are relatively heavy, require a significant amount of space within a computer, require a significant amount of the power in use, and are very susceptible to shock. A hard drive within a portable computer which is dropped is quite likely to cease functioning with a catastrophic loss of data.

Recently, forms of long term storage other than electro-mechanical hard disk drives have become feasible for use in computers. One of these is flash EEPROM. A flash EEPROM memory array includes a large plurality of floating-gate field effect transistors arranged as memory cells in typical row and column fashion with circuitry for accessing the individual cells and placing the memory transistors of those cells in one of two memory conditions. A flash memory cell, like a typical EPROM cell retains information when power is removed.

Flash EEPROM memory has a number of characteristics which adapt it to use as long term memory. It is light in weight, occupies very little space, and consumes less power than electro-mechanical disk drives. More importantly, it is especially rugged. It will withstand without adverse effects repeated drops each of which would destroy a typical electro-mechanical hard disk drive.

A peculiarity of flash EEPROM is that it is erased by applying a high voltage simultaneously to the source terminals of all of the transistors (cells) used in the memory. Because these source terminals are all connected to one another by metallic busing in the array, the entire array (or some subportion thereof) must be erased at once. While an electro-mechanical hard disk will typically store information in a first area of the disk and then rewrite that same area of the disk when the information changes, this is not possible with a flash EEPROM memory array without erasing all of the valid information that remains in the array along with the invalid (dirty) information.

Because of this, one new architecture used for programming and erasing sectors of a flash EEPROM array divides the entire array into smaller separately erasable blocks so that when a block is erased the amount of valid data which must be reprogrammed is reduced. Then, when the information at a data entry changes, the changed information is written to a new sector on an available block rather than written over the old data; and the old data is marked dirty. This allows erasure to be delayed until a large number of dirty sectors have accumulated on a block so that the number of erasure operations is reduced to a minimum. When erasure occurs, all of the valid data in the block to be erased is written to a new block; and then the dirty block is erased and put back in use as a clean block of memory.

This architecture requires that there always be a significant amount of free memory available to store the changing data and to provide room to store the valid data removed from any dirty block during a cleanup operation. This places a significant burden on the memory array. Whereas it is possible for an electro-mechanical hard disk drive to merely mark bad sectors and avoid them, flash EEPROM arrays must keep memory available for use even though that memory may have experienced some forms of data failure. For this reason various circuitry and software processes are utilized to render flash EEPROM as failure proof as possible. In fact, flash EEPROM memory arrays are now estimated to be so fail proof that it has become extremely expensive to test such arrays to determine their failure characteristics.

SUMMARY OF THE INVENTION

It is, therefore, an object of the present invention to provide a method land apparatus for laboratory testing of the failure rate of flash EEPROM memory arrays.

It is another object of the present invention to provide a circuit arrangement which utilizes failure protection circuitry within the flash EEPROM memory array to assist in determining failure rates rapidly and inexpensively.

These and other objects of the present invention are realized in a circuit for testing the data failure rate of a flash memory array comprising means for writing a test pattern to a memory array; and means positioned in a data path prior to the interface between the memory array and circuitry external to the memory array for detecting differences in data read from the memory array and the test pattern written to the memory array, the last mentioned means including means for reading data from the memory array, means for comparing the value of data read from the memory array with the value of data written to the array in the test pattern, and means for storing a indication that a comparison has produced a result indicating a failure to compare.

These and other objects and features of the invention will be better understood by reference to the detailed description which follows taken together with the drawings in which like elements are referred to by like designations throughout the several views.

Notation and Nomenclature

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

DETAILED DESCRIPTION

Figure 1:
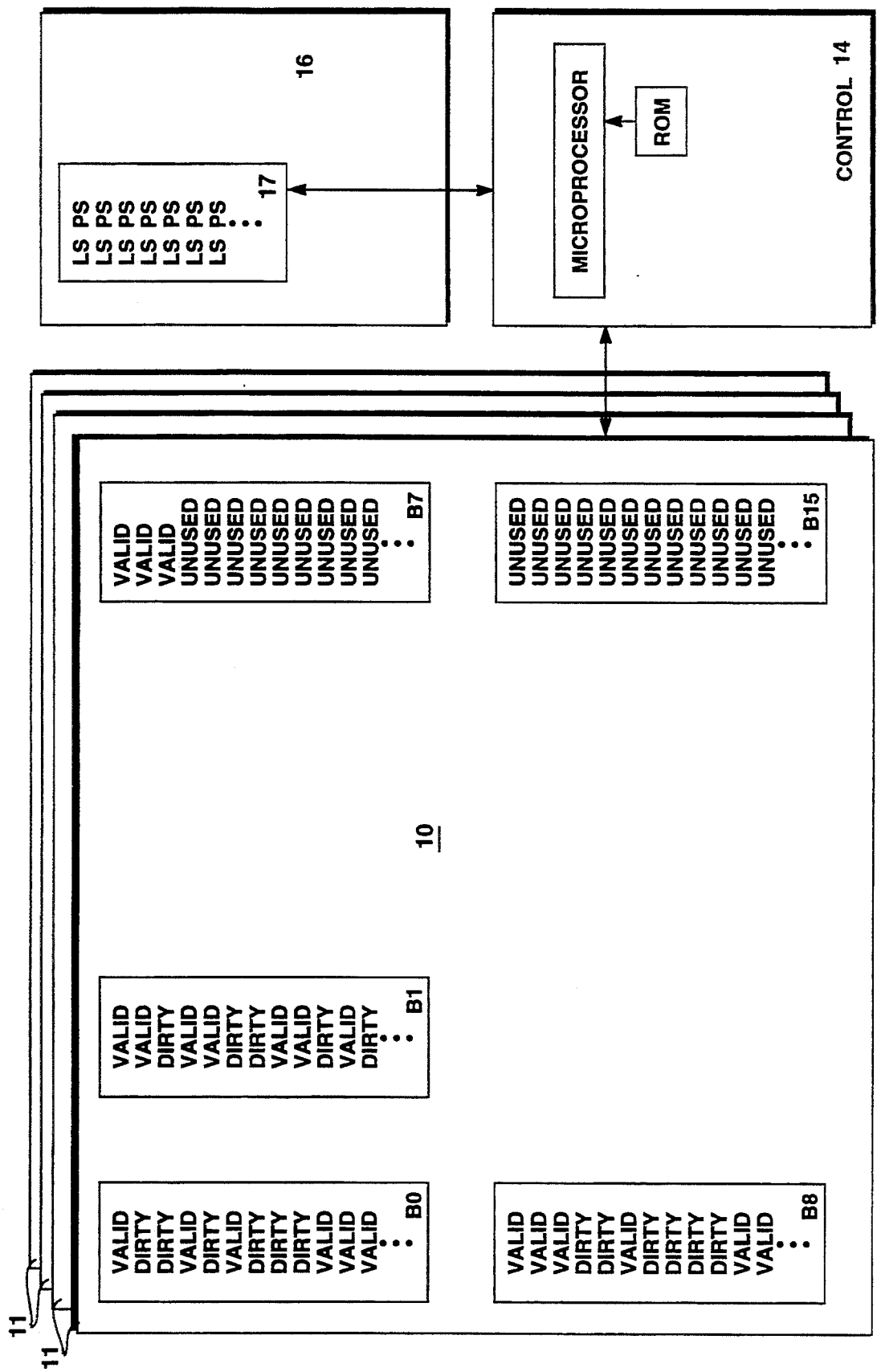
FIG. 1 is a block diagram illustrating a flash EEPROM memory array.

Referring now to FIG. 1, there is illustrated in block diagram form a flash EEPROM memory array 10 in which the present invention may be practiced. The array 10 includes a plurality of blocks B0–B15 of flash EEPROM memory. Each block includes floating-gate field effect transistor memory cells (not shown) arranged in typical row and column fashion and having circuitry arranged for selecting any particular block of memory and any particular row and column so that the memory device at that position may be written or read. The details of the layout of transistor memory arrays and the associated accessing circuitry are well known to those skilled in the art and are, therefore, not shown here. The memory array illustrated is described in detail in U.S. Pat. application Ser. No. 07/969,131, entitled *Method and Circuitry For a Solid State Memory Disk*, S. Wells, filed on even date herewith, and assigned to the assignee of the present invention.

Flash EEPROM memory is essentially an EPROM array with facilities provided so that when divided into blocks in the manner illustrated an entire block may be erased by a high voltage value applied simultaneously to the source terminals of all the memory transistors of the block. Such an erasure places each of the cells in the one condition. When in that condition, a zero or a one may be written to a cell. A one leaves the cell in the same one condition while a zero switches the cell to the zero condition. A cell cannot be switched back from the zero condition to the one condition without the application at its source terminal of the high value of voltage required for erasure. Since all source terminals of the memory transistors are joined together, a cell in a zero state remains in that state until the entire block of the array is erased once again.

In the array 10 illustrated in FIG. 1, blocks B0–B15 of memory are shown positioned on a first chip 11 of the array 10. Additional silicon chips 11 each hold additional blocks of the array 10 to provide a total of number of blocks sufficient to furnish the desired size of memory array.

In general, once any one of the blocks has been erased, data may be written to any position on the entire block. When a host begins writing data to be stored in the array (such as an application program) the data is written sequentially, sector by sector, to the first block having free space until that block has been filled with data. Then writing proceeds to the next block having free space and the writing continues sequentially. At any point after writing is completed, the information may be read back from the array 10 by interrogating the block and sector at which the data is stored.

When updated information is to be written to a sector which already contains information, in contrast to the prior art, the new information is written to new or newly-erased free space on some one of the blocks of the array 10. This, rather than writing over the old information, occurs because the old information can only be rewritten if the entire block on which it is stored is first erased. To erase an entire block without destroying valid data would entail copying all of the valid data to another block of the array 10, erasing the original block, rewriting the valid data back to the original block, then rewriting the updated data over the old entry on the original block. Instead the updated information is written to a new position on a different unfilled block (e.g., block B7), and the old position is marked invalid (dirty) by writing an invalid indication with the dirty sector. A block is usually not erased until a large number of dirty sectors exist and the number of valid sectors to be saved is substantially reduced.

Because of this arrangement by which data is replaced, the sector number which is used to indicate where data is stored is really a logical sector number. In order to allow the use of logical sector numbers, a lookup table 17 listing logical sector numbers against physical sector numbers is utilized with the array 10 so that the physical position in the array 10 at which any particular logical sector exists may be determined. In order to access data, the physical position of the logical sector is determined from the table 17, and the data is sought at that physical position.

Also, because of this arrangement by which data is replaced, each block of the array will after some time have a number of entries which are marked invalid and cannot be used for storage. Consequently, as the array 10 fills with data, a point will come when it is necessary to clear out invalid information from a block in order to provide space for new information to be stored. Typically, the dirtiest block of the array 10 is chosen for erasure. This allows the smallest amount of valid data to be moved to another block of the array from the block to be erased. Once the valid information is written to another block and the new addresses are recorded in the lookup table 17, the block from which the information was read is erased. It is then placed back in operation as an entirely clean block. The cleanup operation is described in detail in U.S. Pat. application Ser. No. 07/969,760, entitled *A Method of Cleaning Up A Solid State Memory Disk Storing Floating Sector Data*, S. Wells, filed on even date herewith, and assigned to the assignee of the present invention.

In order to allow this cleanup operation to occur, some number of blocks must be kept in reserve to be used for changing data and when cleanup is necessary. This necessity to keep some portion of the memory space free requires that flash EEPROM arrays must be made as failure proof as possible. To this end, special precautions such as verifying each write and erase operation are taken. It has also been discovered that a large number of the errors which occur in reading data from a flash EEPROM memory array may be corrected. Consequently, circuitry called read sequencing circuitry has been provided as a part of a control circuit 14 to accomplish this correction. The control circuit 14 also includes a microprocessor which executes various processes stored in read only memory to carry out the various control functions. Among these processes are those for maintaining the logical sector arrangement described, for running the cleanup process, and for operating the read sequencer.

The read sequencing circuitry and its operation are described in detail in U.S. Pat. application Ser. No. 07/969,756, entitled *Method and Apparatus To Improve Read Reliability In Semiconductor Memories*, Wells et al, filed on even date herewith, and assigned to the assignee of the present invention. The effect of this read sequencing circuitry and circuitry used to verify programming and erase Operations is to make flash EEPROM memory arrays much more error free.

However, attempts to read, write, and erase memory arrays sometimes do fail even with all of these protections. It is useful for the designer to know the rate of failure in order to provide measures to protect against such failures, to assure the user of the array, and for other reasons. It has been discovered that the flash EEPROM memory arrays with programming and erase verification and read sequencing are so error free that it is very expensive to test to determine the media failure rate. For example, the probability of raw media failure of a typical electro-mechanical hard disk drives is estimated to be approximately one in $10^{14}$. The probability of raw media failure of flash EEPROM memory array is estimated to be approximately one in $10^{19}$.

The raw data failure rates are a measure of the failure rate of storage arrays. Typically, to determine raw data failure rates known values are written to a drive to be tested and then read out of the array until a sufficient amount of data has been read to provide a useful number. The interface of an electro-mechanical hard disk drive typically transfers one megabyte per second of data. To determine raw data failure rates in electro-mechanical hard disk drive, 150 drives must be read for over twenty-two hours to read out $10^{14}$ bits. This is a conceivable project. However, the project requires a computer to read the data from each drive and 150 drives, a very substantial investment. To read $10^{19}$ bits would require $10^5$ more drives and computers or $10^5$ more time using the same technique. Moreover, the same number of drives and computers would be necessary to read the same number of bits from flash EEPROM memory arrays using the prior art techniques. As can be appreciated, this is an expense which could not be undertaken in developing a marketable memory array.

For this reason, using the techniques and apparatus of the prior art there is no way to determine even the raw media failure rate of flash EEPROM memory arrays in order to determine what steps need to be taken to correct errors. Consequently, the test specifications may be lowered to provide a "guaranteed" raw data failure rate of less than $10^{17}$, for example. Even so the testing is still too expensive using prior art techniques.

The present invention greatly reduces the time necessary to accomplish the testing at an insignificant increase in cost over that of the circuitry already provided. It also eliminates the need for more than one computer to control the testing of whatever number of drives are necessary to make the failure rate determination for a significant cost and logistics savings.

In order to accomplish these results, a small number of circuit elements are added to those elements already utilized by the read sequencing circuitry of the control circuit 14 (mentioned above) to assist in correcting read errors which occur. A great proportion of read errors in flash EEPROM memory arrays are caused by the transistors of the memory cells taking longer than the prescribed period to provide an output signal indicative of the state of the cell. Although the state of a cell may be correctly switched and a correct condition may be stored, the time to read the cell appears to lengthen with the number of programming operations conducted on the cell. Consequently, the time required for the signal produced at the output driver to settle to its final state lengthens. To overcome this problem, the read sequencing circuit has been provided for use with flash EEPROM memory arrays.

Figure 2:
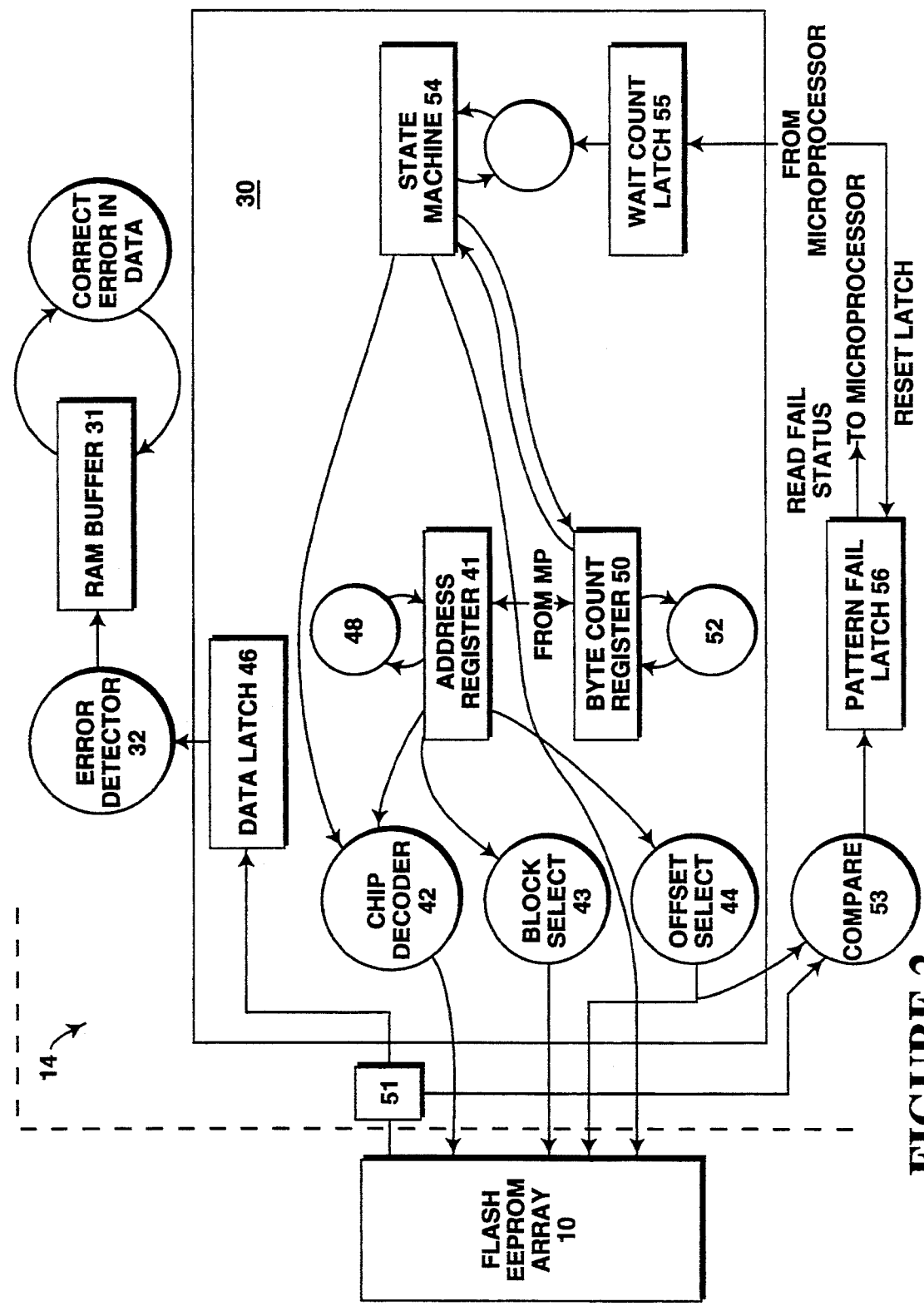
FIG. 2 is block diagram illustrating circuitry designed to enhance the read reliability of a flash EEPROM memory array and including circuitry in accordance with the invention for allowing rapid and inexpensive testing of the failure rate of the flash EEPROM memory array.

FIG. 2 illustrates a portion of the control circuit 14 including the read sequencing circuit 30 devised for overcoming errors caused by the lengthening of the switching time for the memory cells of a flash EEPROM array. This review of the operation of the read sequencing circuitry 30 is offered to assist in understanding how a portion of that read sequencing circuitry may be utilized with additional circuitry to provide the present invention.

When an attempt is made to read a sector of data, the data is first read from the block of the flash array 10 to the read sequencer circuit 30. The read sequencer circuit 30 controls the period of interrogation for the memory cells so that when a read error occurs in a particular sector, an error caused by a slowdown in the ability of the memory cells to provide an output may be overcome. The read sequencer 30 receives the address of a sector of information to be read and causes that information to be read and stored in a RAM buffer 31. During the read operation, the read sequencer 30 stores certain information related to the particular sector being read until it has been determined that the information read is correct.

The read sequencer 30 illustrated in FIG. 2 includes a register 41 which stores the address which is to be read from the block of the array. In one embodiment of the invention, this includes the chip number of the silicon substrate upon which the particular block being interrogated resides, the block address, and the offset into the block at which the data may be found. These values are provided to the register 41 of the read sequencer 30 by the microprocessor of the control circuit 14 illustrated in FIG. 1. As mentioned, the circuit 14 includes a microprocessor and read only memory in which are stored processes which may be run on the microprocessor. The microprocessor of the control circuit 14 derives the address values under program control from offset values stored with the sectors on the block from which data is sought. The address register 41 provides this information to a chip decoder circuit 42 which selects the appropriate chip, a block select circuit 43 which selects the appropriate block, and an offset select circuit 44 which selects the particular data at the offset on the block. The circuits for accomplishing these various elements of the address decoding operation are well known to those skilled in the art of computer design and are therefore not discussed in detail here. The first byte of data at the particular address is read from the flash memory array. As each byte is read, it is transferred from the flash memory cells to the output of the array and latched in a data latch 46, the period at which each byte is latched after the initiation of the read signal being under control of the read sequencer 30. Initially this period is set to be the normal (default) output period by a value placed in a wait count latch 55. Each byte of the data in the data latch 46 is transferred to the error detection circuitry 32.

The read sequencer 30 also includes an incrementer circuit 48 constructed in a manner well known to those skilled in the prior art which sequentially advances the address held in the register 41 as each byte of data is read from the addressed sector of the block of memory being read. Another register 50 stores an initial count of the number of bytes to be read from the sector, the number being determined from beginning and ending addresses of the sector and furnished by the circuit 14.

A decrementer circuit 52 constructed in a manner well known to those skilled in the art is associated with the count register 50. The decrementer circuit 52 reduces the count held in the register 50 as each byte of data is read from the addressed sector.

During operation, the read sequencer 30 receives an address and the length of the sector from the circuit 14 and selects the first byte of information to be read at the address indicated by the pointer stored in the block with the logical sector number. The byte of data is read out of the block of the array and latched by the latch 46. The interval of time after the read signal is applied to the cells of the memory array until the data is latched is controlled by a state machine 54 which receives the wait count from the latch 55. The period is initially set at a default time sufficient to allow for read out of the memory cells so long as those cells are within specification limits. The incrementer circuit 48 increases the address held in the register 41 by one byte in the sequence of addresses so that the next byte in the sector will be read. At the same time, the decrementer circuit 52 reduces the count of bytes to be read held in the register 50 by one. Data is read byte by byte until the entire sector has been read out (including its error detecting and correcting code) and transferred to the error detection circuit 32 where the correctness of the data is determined.

The correctness of the information is determined at an error detection circuit 32 which lies in the path to the buffer RAM 31. The circuit 32 functions in accordance with the dictates of the prior art using error detection code stored with each sector of data on the flash EEPROM array. This code allows detection and correction of single and multiple bit errors. Error detection and correction code of this type is well known to those skilled in the art and is widely used in protecting data stored on electro-mechanical hard disks. Examples of error detecting and correcting using such code and the operation such code performs are detailed, for example, in *Practical Error Correction Design For Engineers*, Revised 2d Edition, Glover and Trent, published by Cirrus Logic Press, copyright 1990. A block redundancy check code provides parity bits for checking the contents of the rows and columns of a block of data stored in the memory array.

The circuit 14 tests the status of the error detection circuit 32 to determine whether an error has occurred. Presuming that the data read is correct as determined by the error detection circuit 32, the circuit 14 moves on to accomplish its next operation and the latching period for reading data remains at the normal time for the array cells, approximately 120 nanoseconds (a time which will vary with particular circuitry).

If, however, the error detection circuit 32 signals that there is an error in the data which has been read, then the circuit 14 resets the address in the address register 41 to the initial address of the sector at which the incorrect data was read and provides a new wait count to the latch 55 which controls the state machine 54 to lengthen the latching period for the data received from the array 10 by the data latch 46. In effect, as a first step where an error is found, the read sequencer 30 retries the read of the particular sector of information to determine whether, by extending the time (the settling time or access time of the chip) at which the data read from the array is latched, correct information will be read. If the error detection circuit 32 finds that the data is still incorrect, the circuit 14 next moves to a step at which an attempt to correct the data is made using various error correcting software algorithms available to the controller 14.

Of especial importance to the present invention is the fact that the read sequencer circuit 30 is a part of the memory array control circuitry and handles data from the array before it reaches the interface with the host computer. Consequently, data read by the read sequencer 30 is not constrained to the rate dictated by the interface to the computer. The read sequencer circuit 30 handles the data being read at a much more rapid rate than does the interface, a rate of approximately thirteen megabytes per second. Consequently, if data is derived for raw data failure rate testing at the read sequencer circuit 30, it may be handled much more rapidly than if read by the host across the interface with the memory array.

This is the approach taken by the present invention. The read sequencer circuit 30 includes a number of circuit components which may be combined with additional new elements to provide the present invention which allows the data failure rate testing of the flash EEPROM memory arrays.

Another important advantage of reading at the read sequencer 30 is that the read sequencer 30 contains a number of elements which provide functions which would normally have to be provided by a computer controlling the reading of data from the flash EEPROM memory arrays. This includes the circuitry which provides a read out of each memory position. In addition, the microprocessor of the control circuit 14 used with the flash EEPROM arrays to control the read operation has the facility to control other operations including an operation which furnishes a pattern to be stored in the array and read out for failure detection and an operation for detecting the errors present during that testing read out. This relieves the computer of the necessity of continuously controlling the read operation during the test operation. All that a computer needs to do is act as a switch to start the read operation and then check for errors at a regular interval. This essentially means that a single computer can control the read out of all of the flash EEPROM memory arrays involved in a raw data failure testing operation rather than an individual computer being required for each flash EEPROM memory array. This drastically reduces the cost of such a raw data failure rate testing procedure by a factor of ten times.

The additional circuit elements combined with elements of the circuit 30 include switching circuitry 51. Circuitry 51 routes the data values read from the flash EEPROM memory array by the read sequencer 30 to the test process. The circuitry for accomplishing the present invention also includes a compare circuit 53 which receives the data read and compares the value of the data read from the flash EEPROM memory array with the value of the data expected to be read. Normally, these values will be the same, and no output will result. However, in the case of an error, a signal is generated to set a data pattern fail latch 56. The state of the latch 56 may then be read by the computer controlling the testing operation and the latch reset. The computer may total the number of errors detected by use of a simple software counting program.

The present circuit is adapted to eliminate almost entirely the need for a computer to control the testing operation including furnishing and reading the data and detecting errors by utilizing the value of the address offset into the flash EEPROM memory array as the value of the data stored in the flash EEPROM memory array and checked for error. In this manner, with each bit of data read from the flash EEPROM memory array, the address offset value is read and compared. Thus no separate arrangement for providing the values of data to be stored within the flash EEPROM memory array and read back is necessary and those values need not be stored during the testing, yet the comparative "to-be-expected" values are always ready and available as each byte is read from the array. Moreover, the control of the writing the test data to the array, reading the data back, and comparing the data read with that written is handed off to the controller 14 used by the flash EEPROM memory array so that essentially nothing needs be done by the external computer other than the simple "go" which starts the test for each block tested and storing the count of errors provided by the individual controllers 14 of the flash EEPROM memory array.

In one embodiment, in order to conduct the failure detection operation, the microprocessor of the control circuit 14 writes a sequence of addresses from 0000 through FFFFhex into the memory cells 0000 to FFFF of a block to be checked. Then the read sequencer 30 is loaded with beginning block address values in the address register 41 and the byte count register 50 so that the entire block will be read. The pattern fail latch 56 is then reset by the microprocessor of the controller 14, and the read operation by the read sequencer 30 is begun. The read sequencer 30 will read all of the data in the block out of the block, and the compare circuit 53 will compare each word of data read with the value derive from the offset select for the address from which that data was read. If any word read is not the same as the offset address, the pattern fail latch 56 will be set to indicate a read failure. When the transfer is complete, the latch is read; and any failure is detected. Thus, the internal microprocessor of the circuit 14 only has to write the test pattern, tell the read sequencer the block addresses to be read, set the limits, and read the pattern fail latch output when the test for each block is complete. This is a trivial involvement for the microprocessor of the controller 14. However, it relieves an external computer of any need to do anything other than tell the microprocessor of the controller 14 to start the test and read the total number of failures presented by the microprocessor.

Moreover, since the testing operation is conducted before the data interface with the host computer, the speed at which the circuitry of the read sequencer 30 combined with the circuitry added by the present invention operates is over ten times that of the prior art. This is a speed such that substantial failure testing becomes possible with the invention.

Figure 3:
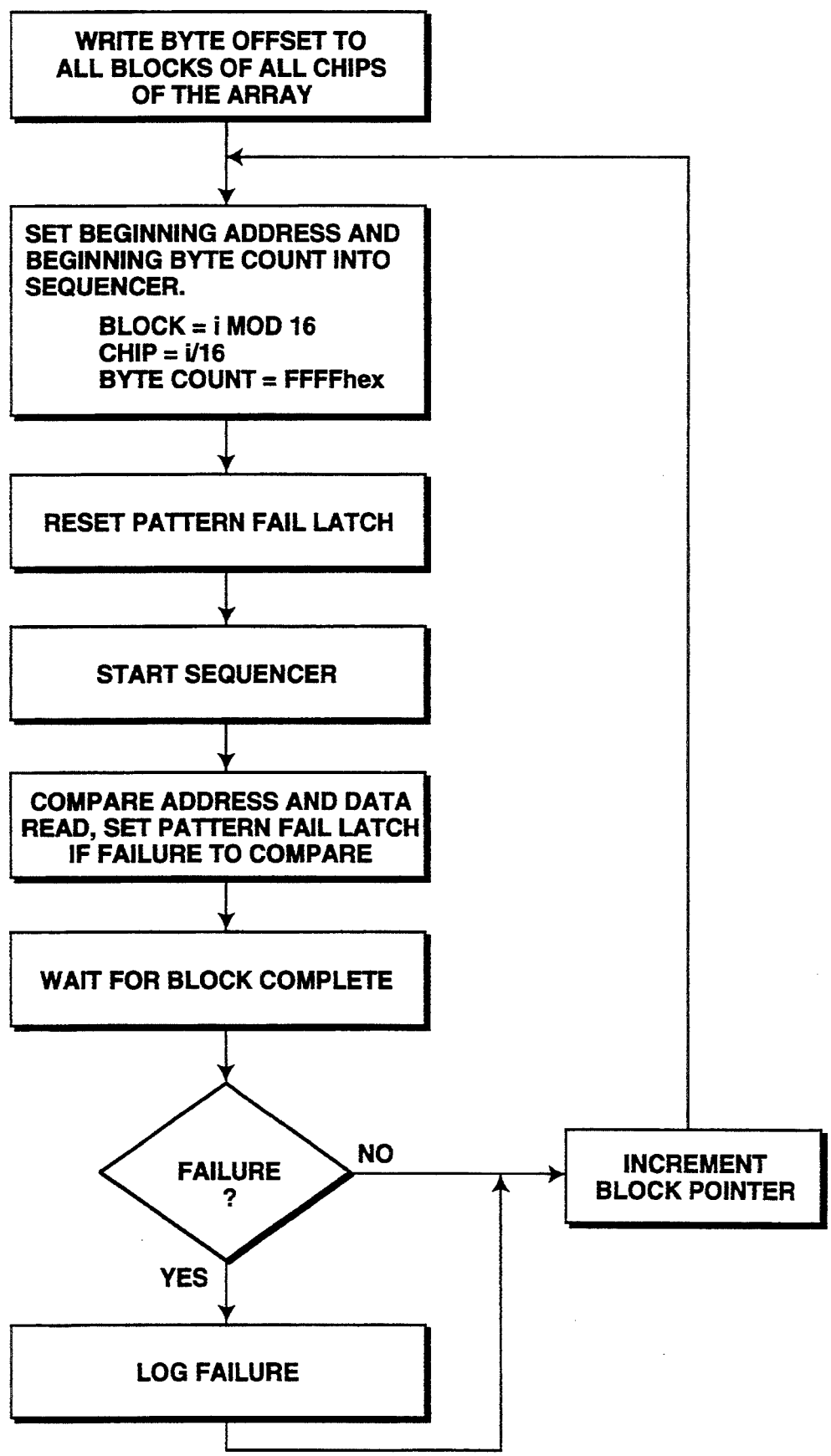
FIG. 3 illustrates a method in accordance with the present invention.

FIG. 3 illustrates the process of testing a complete flash EEPROM memory array in accordance with the invention. At a first step the offset for each byte of each block of the memory array is written to each byte of the array. Thus, each byte will contain its own address. Next, the beginning address (zero) is set into the sequencer with the beginning byte count (total in the array). This step illustrates the algorithm utilized for sequencing through the blocks as they are read. As the program increments, the block on a chip being tested is equal to the total block number (0–240 in one embodiment) modulo sixteen, the chip in which the block is positioned is equal to the total block number divided by 16 (integer division). Next, the pattern fail latch 56 is reset. The sequencer circuit 30 is started and tests each byte read at the compare circuit 53. Typically the switch 51 will disable the normal detection process of the read sequencer circuit 30 at this point because the data in the array is meaningless. The operation proceeds through the block until that block is read. If no failure is detected, the block counter is incremented and the next block is read and tested. If an error occurs during block testing, this is read by the computer controlling the test and the pattern fail latch reset. When the controlling computer specifies, the block count is incremented and the test proceeds.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A circuit for testing the data failure rate of a memory array having controller means for controlling an input/output data path to the array, the circuit comprising:

means in the controller means for writing a test pattern to the memory array; and
   means in the controller means for detecting differences in data read from the memory array and the test pattern written to the memory array, the last mentioned means including means for reading data from the memory array,
     means for comparing the value of data read from the memory array with the value of data written to the array in the test pattern, and
     means for storing a indication that a comparison has produced a result indicating a failure to compare.
   means for reading data from the memory array comprises means for reading data at a first rate greater than that at which the data may be read by a host.

2. A circuit for testing the data failure rate of a memory array as claimed in claim 1 in which the means in the controller means for writing a test pattern to a memory array includes means for writing a test pattern in which each position of the array stores a derivation of the offset address of the position.

3. A circuit for testing the data failure rate of a memory array as claimed in claim 2 in which the means for comparing the value of data read from the memory array with the value of data written to the array in the test pattern comprises means for detecting the address at which each position of data read resides for comparison with the value of the data read.

4. A circuit for testing the data failure rate of a memory array as claimed in claim 1 in which the means for reading data from the memory array comprises means for reading data at a first rate, means for detecting a read error, and means for reading data at a rate slower than the first rate when a read error is detected.

5. A circuit for testing the data failure rate of a memory array as in claim 1 in which the memory array is a flash memory array.

* * * * *

UNITED STATES PATENT AND TRADEMARK OFFICE
CERTIFICATE OF CORRECTION

PATENT NO. : 5,416,782
DATED : May 16, 1995
INVENTOR(S) : Wells et al.

It is certified that error appears in the above-identified patent and that said Letters Patent is hereby corrected as shown below:

In column 2 at line 27 delete "land" and insert --and--

In column 4 at line 10 delete "program)" and insert --program),--

In column 5 at line 27 delete "Operations" and insert --operations--

Signed and Sealed this

Fifth Day of November, 1996

Attest:

BRUCE LEHMAN

Attesting Officer

Commissioner of Patents and Trademarks